(12) United States Patent
Takeya et al.

(10) Patent No.: US 7,248,274 B2
(45) Date of Patent: Jul. 24, 2007

(54) THERMAL HEAD HAVING ADHESIVE LAYER PARTIALLY DISPOSED ON HEAT SINK AND METHOD FOR MANUFACTURING SUCH THERMAL HEAD

(75) Inventors: Tsutomu Takeya, Niigata-ken (JP); Shigeto Yamada, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 239 days.

(21) Appl. No.: 11/092,328

(22) Filed: Mar. 29, 2005

(65) Prior Publication Data
US 2005/0219348 A1 Oct. 6, 2005

(30) Foreign Application Priority Data
Mar. 30, 2004 (JP) .............................. 2004-100226

(51) Int. Cl.
*B41J 2/335* (2006.01)
(52) U.S. Cl. ...................................... 347/200
(58) Field of Classification Search ................ 347/200, 347/201, 205, 207, 210, 211
See application file for complete search history.

(56) References Cited

U.S. PATENT DOCUMENTS 5,278,580 A * 1/1994 Nishikawa et al. ......... 347/114

FOREIGN PATENT DOCUMENTS

JP 7-323592 12/1995
JP 11-028829 * 2/1999

\* cited by examiner

*Primary Examiner*—Huan Tran
(74) *Attorney, Agent, or Firm*—Brinks Hofer Gilson & Lione

(57) ABSTRACT

A thermal head has a head substrate including exothermic bodies which generate heat when electricity is supplied thereto, a common electrode connected with first ends of the exothermic bodies, and independent electrodes connected with second ends of the exothermic bodies. A printed circuit board (PCB) includes driving elements controlling the electricity supplied to the exothermic bodies. The head substrate and PCB are attached on a heat sink such that an end surface of the head substrate adjoins an end surface of the PCB. The independent electrodes are wire-connected with the corresponding driving elements across a gap between the adjoining end surfaces to define a wire-connection unit, which is sealed with resin. An adhesive layer is partially disposed between the PCB and the heat sink such that a space is provided therebetween. The space communicates with the outside of the thermal head and with the gap.

23 Claims, 3 Drawing Sheets

THERMAL HEAD HAVING ADHESIVE LAYER PARTIALLY DISPOSED ON HEAT SINK AND METHOD FOR MANUFACTURING SUCH THERMAL HEAD

CLAIM FOR PRIORITY

This application claims the benefit of priority to Japanese Patent Application 2004-100226, filed on Mar. 30, 2004, herein incorporated by reference.

TECHNICAL FIELD

The present application relates to thermal heads installed in, for example, thermal-transfer printers, and to methods for manufacturing such thermal heads.

BACKGROUND

A typical thermal head is provided with a plurality of exothermic bodies which generate heat when electricity is applied thereto. The thermal energy generated by the exothermic bodies is supplied to a recording medium in order to perform a recording operation. Conventionally, a thermal head is provided with a head substrate and a printed circuit board, which are attached on an aluminum heat sink. The head substrate includes the plurality of exothermic bodies, a common electrode connected with first ends of the exothermic bodies, and a plurality of independent electrodes connected with corresponding second ends of the exothermic bodies. On the other hand, the printed circuit board includes a plurality of driving elements for controlling the electricity supplied to the exothermic bodies via the independent electrodes of the head substrate. The head substrate and the printed circuit board are disposed on the aluminum heat sink in a manner such that an end surface of the head substrate and an end surface of the printed circuit board adjoin each other. The independent electrodes of the head substrate and the driving elements of the printed circuit board are correspondingly wire-connected with each other across a bordering section between the head substrate and the printed circuit board so as to form a wire-connection unit. Such a wire-connection unit is sealed with a sealing-resin material, such as epoxy resin, whose viscosity decreases when heat is applied thereto. The sealing-resin material covers the wire-connection unit without leaving any empty spaces.

In the thermal head having the structure described above, it is actually difficult to make the end surface of the printed circuit board adjoining the head substrate exactly flat, and due to this reason, a small gap is formed between the head substrate and the printed circuit board. When a heated sealing-resin material in a low viscosity state enters the gap between the head substrate and the printed circuit board, the sealing-resin material traps air inside the gap, causing the air to expand. As a result, air bubbles are formed in the sealing-resin material. The formation of such air bubbles can lead to problems such as uneven surfaces or air holes formed in the hardened sealing-resin material. To prevent such problems, Japanese Unexamined Patent Application Publication No. 7-323592, for example, discloses a structure in which a section of the heat sink below the sealing portion in the gap between the head substrate and the printed circuit board is provided with a groove through which the air can be released outward.

However, according to such a heat sink provided with a groove, it has been discovered that the heated sealing-resin material in a low viscosity state moves further past the gap between the head substrate and the printed circuit board to enter the groove in the heat sink, and as a result, the sealing-resin material adheres to an elastic adhesive provided for an attachment between the head substrate and the heat sink. If the sealing-resin material adheres to the elastic adhesive, the head substrate and the heat sink become tightly combined with each other. This increases the rigidity between the head substrate and the heat sink, or in other words, reduces the elasticity between the two. In this case, even when the sealing-resin material hardens while the heat sink is thermally expanded, the elastic adhesive cannot absorb such thermal expansion of the heat sink. This forces the top and bottom surfaces of the head substrate to warp significantly. In order to increase the yield, the head substrate is kept flat as much as possible.

BRIEF SUMMARY

Accordingly, the present application provides a thermal head that prevents air holes from being formed in a sealing portion and inhibits warping of a substrate caused by thermal expansion. A method for manufacturing such a thermal head is also provided.

In one embodiment, an adhesive layer provided for an attachment between a printed circuit board and a heat sink is only partially disposed therebetween such that a space is provided below an end surface of a head substrate and an end surface of the printed circuit board adjoining each other. This space connects a gap formed between the adjoining end surfaces with the outside of the thermal head.

Specifically, in one embodiment a thermal head is provided which includes a head substrate including a plurality of exothermic bodies which generate heat when electricity is supplied thereto, a common electrode connected with first ends of the exothermic bodies, and a plurality of independent electrodes connected with corresponding second ends of the exothermic bodies. A printed circuit board includes a plurality of driving elements for controlling the electricity supplied to the exothermic bodies on the head substrate. The head substrate and the printed circuit board are disposed on a heat sink such that an end surface of the head substrate and an end surface of the printed circuit board adjoin each other. The independent electrodes and the driving elements are wire-connected with each other across a gap formed between the adjoining end surfaces of the head substrate and the printed circuit board so as to define a wire-connection unit. The wire-connection unit is sealed with a resin material. The printed circuit board and the heat sink have an adhesive layer partially disposed therebetween such that a space is provided between the printed circuit board and the heat sink. The space communicates with the outside of the thermal head and with the gap between the adjoining end surfaces of the head substrate and the printed circuit board.

In one embodiment, the space is disposed below the adjoining end surfaces of the head substrate and the printed circuit board. The space is symmetrical in plan view with respect to a line perpendicular to a direction in which the adjoining end surfaces extend. The symmetrical space allows the adhesive layer partially disposed between the printed circuit board and the heat sink to contract more evenly when the adhesive layer hardens. Thus, the printed circuit board can be attached horizontally on the heat sink in a well-balanced manner. In order to make the space symmetrical, the adhesive layer may have a central portion and two side portions in plan view with respect to a direction in which the adjoining end surfaces extend. The central portion extends longer than the side portions in a direction perpendicular to the direction in which the adjoining end surfaces extend.

In another embodiment, attachment surfaces of the heat sink, the head substrate, and the printed circuit board are flat.

In another embodiment, a method for fabricating a thermal head is provided. The method includes providing a head substrate including a plurality of exothermic bodies which generate heat when electricity is supplied thereto, a common electrode connected with first ends of the exothermic bodies, and a plurality of independent electrodes connected with corresponding second ends of the exothermic bodies; providing a printed circuit board including a plurality of driving elements for controlling the electricity supplied to the exothermic bodies on the head substrate; and a heat sink on which the head substrate and the printed circuit board are disposed such that an end surface of the head substrate and an end surface of the printed circuit board adjoin each other. The independent electrodes and the driving elements are wire-connected with each other across a gap formed between the adjoining end surfaces of the head substrate and the printed circuit board so as to define a wire-connection unit. The wire-connection unit is sealed with a resin material. The printed circuit board and the heat sink have an adhesive layer partially disposed therebetween such that a space is provided between the printed circuit board and the heat sink, the space communicating with the outside of the thermal head and with the gap between the adjoining end surfaces of the head substrate and the printed circuit board.

The method may include attaching the head substrate onto the heat sink; applying a first adhesive onto the heat sink in a direction parallel to the end surface of the head substrate to be adjoining the printed circuit board at a substantially uniform width; applying a second adhesive to a central portion of the first adhesive such that the second adhesive forms a substantially circular shape in plan view; spreading the first adhesive and the second adhesive towards the head substrate so as to form an adhesive layer having a central portion and two side portions in plan view with respect to a direction in which the end surface of the head substrate to be adjoining the printed circuit board extend, the central portion extending longer than the side portions in a direction perpendicular to the direction in which the end surface of the head substrate extend; and attaching the printed circuit board onto the heat sink via the adhesive layer such that the end surface of the printed circuit board and the end surface of the head substrate adjoin each other.

The method described above may further include wire-connecting the independent electrodes in the head substrate with the driving elements in the printed circuit board so as to form the wire-connection unit; and sealing the wire-connection unit. Accordingly, even if the attachment surface area of the head substrate is reduced due to a size reduction of the head substrate, the tolerance level against the bending of the head substrate can be increased since the head substrate is preliminarily attached to the heat sink. This prevents the head substrate from warping caused by the thermal expansion of the heat sink.

In another embodiment, the thermal head includes a head substrate, a printed circuit board, a heat sink, a resin, and an adhesive layer. The head substrate and the printed circuit board are disposed on the heat sink such that an end surface of the head substrate and an end surface of the printed circuit board adjoin each other with a gap therebetween. The resin covers the head substrate and the printed circuit board. The resin is disposed between the adjoining end surfaces of the head substrate and the printed circuit board to form a boundary of the gap. The adhesive layer attaches the heat sink and the printed circuit board such that a space connecting the outside of the thermal head and the gap is formed between the heat sink and the printed circuit board.

In another embodiment, the thermal head includes a head substrate, a printed circuit board, a heat sink, a resin, and means for preventing air holes from being formed in the resin and inhibiting warping of the head substrate caused by thermal expansion. The head substrate and the printed circuit board are disposed on the heat sink such that an end surface of the head substrate and an end surface of the printed circuit board adjoin each other with a gap therebetween. The resin covers the head substrate and the printed circuit board. The resin is disposed between the adjoining end surfaces of the head substrate and the printed circuit board.

Accordingly, a thermal head and a method for manufacturing such a thermal head are provided that prevent air holes from being formed in a sealing portion and that inhibit warping of a substrate caused by thermal expansion.

DESCRIPTION OF THE PREFERRED EMBODIMENTS

Figure 1:
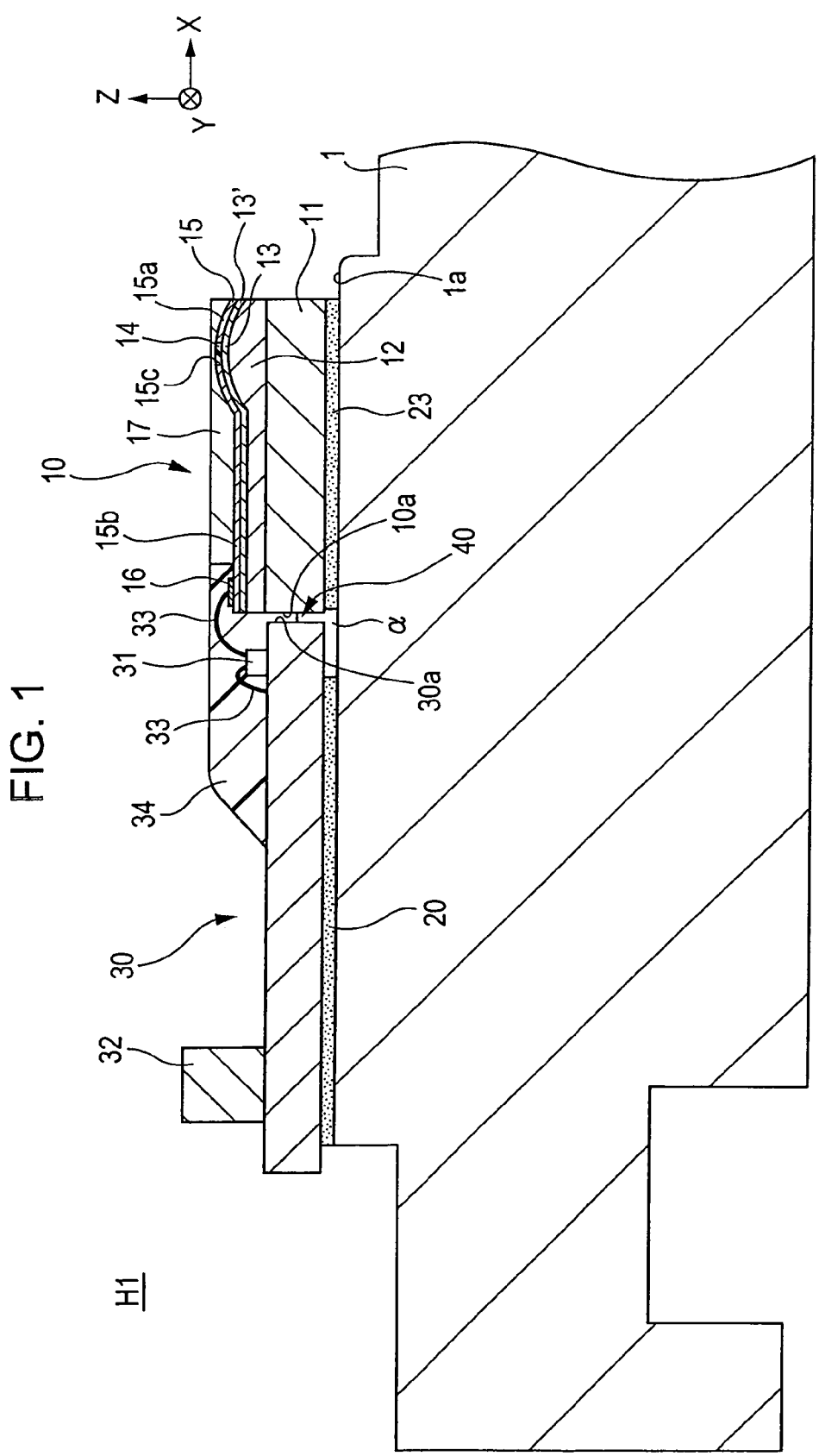
FIG. 1 is a cross-sectional view of a thermal head according to a first embodiment of the present invention.

FIG. 1 is a cross-sectional view illustrating a thermal head H1 according to a first embodiment of the present invention. The thermal head H1 includes a head substrate 10 shown in FIG. 2 and a printed circuit board 30, which are attached on an aluminum heat sink 1. The head substrate 10 and the printed circuit board 30 are disposed on a top surface 1a of the aluminum heat sink 1 such that end surfaces 10a and 30a of the respective head substrate 10 and the printed circuit board 30 face and adjoin each other. The adjoining end surfaces 10a and 30a of the respective head substrate 10 and printed circuit board 30 actually have a gap 40 therebetween. Although the gap 40 in FIG. 1 is given a relatively large dimension for better viewability purposes, the actual gap 40 is significantly smaller relative to the other elements in the figure.

Figure 2:
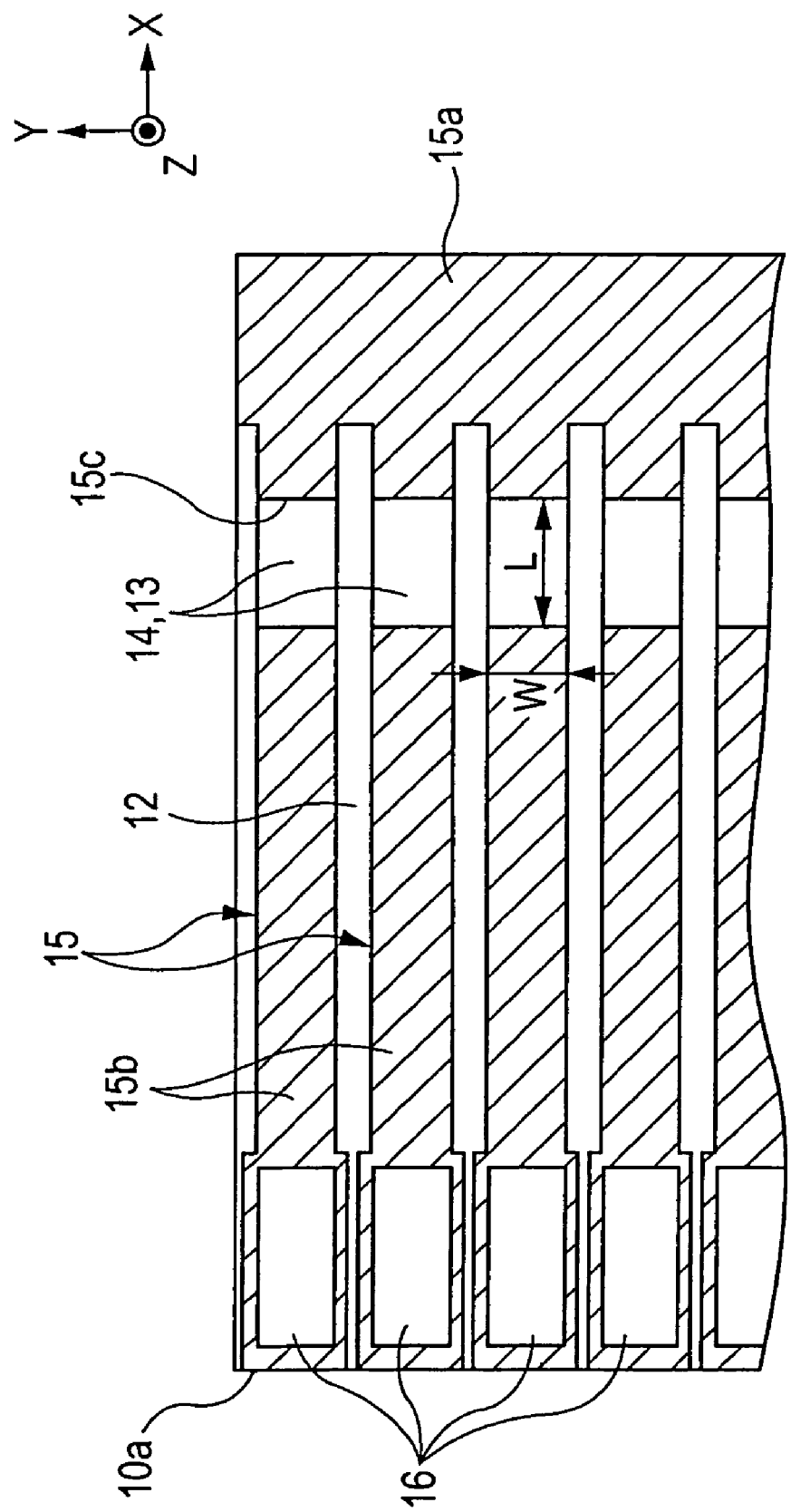
FIG. 2 is a plan view illustrating a head substrate shown in FIG. 1 in which a wear-resistant protection layer is omitted.

Referring to FIGS. 1 and 2, the head substrate 10 includes a base plate 11 composed of an alumina material or a ceramic material; a glazed layer 12 disposed over the base plate 11 and provided with a protruding portion adjacent to a first end of the head substrate 10 and a flat portion having a uniform thickness and extending from the protruding portion towards a second end of the head substrate 10; a plurality of exothermic bodies 13 disposed on the protruding portion of the glazed layer 12; a plurality of insulating-barrier-film components 14 each covering one of the exothermic bodies 13 and defining the planar dimension (resistance length L, resistance width W) of the corresponding exothermic body 13; an electrode layer 15 for transmitting electricity to the exothermic bodies 13; and a wear-resistant protection layer 17 for preventing the insulating-barrier-film components 14 and the electrode layer 15 from being in contact with, for example, a platen. The exothermic bodies 13 are segments of a resistance layer 13' disposed over the glazed layer 12 and are arranged at a predetermined interval in the y-axis direction shown in the drawings. In the manufacturing process of the thermal head H1, the electrode layer 15 is formed entirely over the resistance layer 13' and the insulating-barrier-film components 14, and subsequently, openings 15c are formed in the electrode layer 15 so that the top surfaces of the insulating-barrier-film components 14 are exposed through these openings 15c. Consequently, the openings 15c separate the electrode layer 15 into a common electrode 15a and a plurality of independent electrodes 15b. Specifically, with respect to the direction of the resistance length L, the single common electrode 15a is connected with first ends of all of the exothermic bodies 13, whereas the independent electrodes 15b are connected with corresponding second ends of the exothermic bodies 13. Each of the independent electrodes 15b is provided with an electrode pad 16 for wire-connection. The electrode layer 15 and the electrode pads 16 in the first embodiment are composed of, for example, Al. The head substrate 10 is attached on the aluminum heat sink 1 via an adhesive layer 23 having elasticity and absorbability for thermal-strain compensation.

The printed circuit board 30 is provided independently of the head substrate 10, and includes, for example, a plurality of driving elements 31 for controlling the electricity supplied to the exothermic bodies 13; and a connector 32 for connecting a circuit unit on the printed circuit board 30, which includes the driving elements 31, with an external unit. The number of the driving elements 31 provided corresponds to the number of the exothermic bodies 13, and the driving elements 31 are arranged adjacent to a side of the printed circuit board 30 adjoining the head substrate 10. The driving elements 31 are connected with the corresponding electrode pads 16 of the independent electrodes 15b in the head substrate 10 via corresponding Au connection wires 33, which are bridged over the gap 40 between the head substrate 10 and the printed circuit board 30. The independent electrodes 15b, the electrode pads 16, the electrodes of the driving elements 31, and the Au connection wires 33 define a wire-connection unit. Such a wire-connection unit is sealed with sealing resin 34, such as epoxy resin. The sealing resin 34 also partially seals the gap 40 between the head substrate 10 and the printed circuit board 30 such that the upper portion of the gap 40 is blocked. Furthermore, the electrodes of the driving elements 31 are also connected with the circuit unit on the printed circuit board 30 via the Au connection wires 33.

Figure 3:
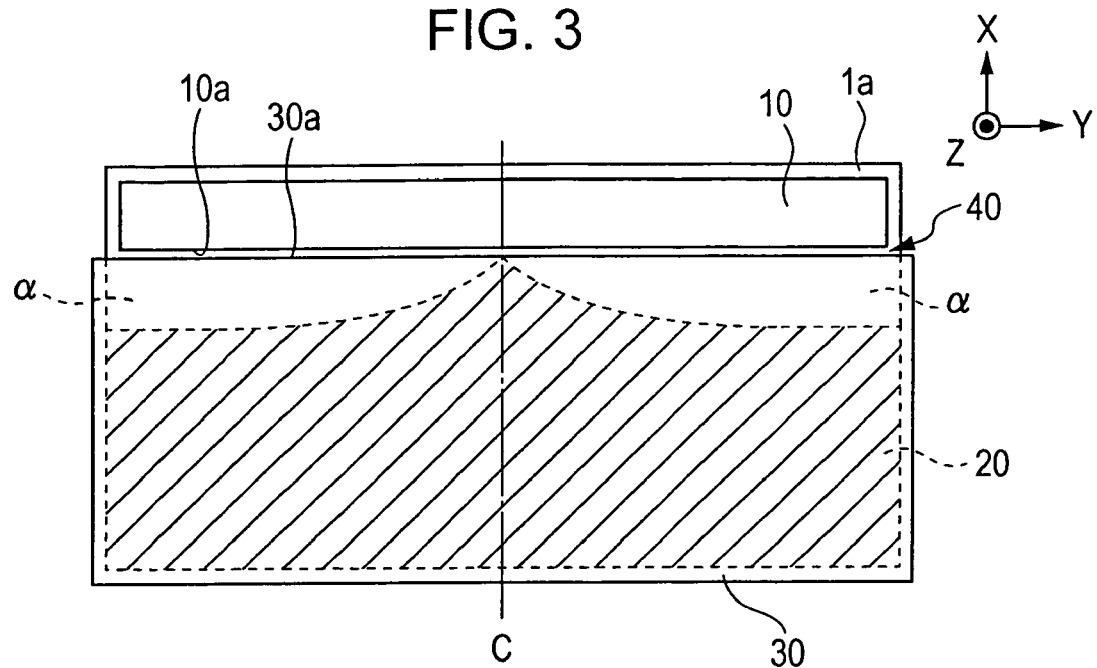
FIG. 3 is a plan view illustrating an adhesive layer shown in FIG. 1.

The printed circuit board 30 and the aluminum heat sink 1 have a space α and an adhesive layer 20 disposed therebetween. Specifically, the space α communicates with the outside of the thermal head H1, and the adhesive layer 20 is disposed only partially between the printed circuit board 30 and the aluminum heat sink 1 in order to allow the space α to communicate with the gap 40 between the head substrate 10 and the printed circuit board 30. The attachment surfaces of the printed circuit board 30 and the aluminum heat sink 1 are flat without any unevenness from a macroscopic viewpoint, such that the occupied area and the thickness of the adhesive layer 20 define the dimension of the space α. In detail, referring to FIG. 3, the adhesive layer 20 is substantially pentagonal in plan view, such that the adhesive layer 20 includes a central portion C and two side portions with respect to the direction in which the adjoining end surfaces 10a and 30a of the respective head substrate 10 and printed circuit board 30 extend, i.e. the y-axis direction. The central portion C extends longer than the side portions in a direction perpendicular to the adjoining end surfaces 10a and 30a, i.e. the x-axis direction. The adhesive layer 20 is symmetrical with respect to the central portion C. Consequently, a space between the printed circuit board 30 and the aluminum heat sink 1 and where the adhesive layer 20 is not present defines the space α. The space α is thus provided below the adjoining end surfaces 10a and 30a of the respective head substrate 10 and printed circuit board 30, and has two parts which are symmetrical to each other with respect to a line perpendicular to the direction in which the adjoining end surfaces 10a and 30a extend. Furthermore, the dimension of the space α is at minimum at the central portion C, and increases gradually from the central portion C towards the two side portions. The two parts of the space α communicate with the outside of the thermal head H1. The space α allows the gap 40 and the outside of the thermal head H1 to communicate with each other, and thus serves as air-vent passageways.

A method for manufacturing the thermal head H1 according to a second embodiment will now be described.

First, the head substrate 10, the printed circuit board 30, and the aluminum heat sink 1 shown in FIG. 1 are prepared. Subsequently, the adhesive layer 23 is coated over a first area of the top surface 1a of the aluminum heat sink 1 to which the head substrate 10 is to be attached. The head substrate 10 is then attached onto this first area via the adhesive layer 23. In this case, the head substrate 10 is attached in a manner such that the end surface 10a having the plurality of independent electrodes 15b arranged adjacent thereto is placed adjacent to a second area of the top surface 1a of the aluminum heat sink 1 to which the printed circuit board 30 is to be attached. The adhesive layer 23 is composed of, for example, a silicon resin material having elasticity and absorbability that can compensate for thermal expansion of the aluminum heat sink 1.

Figure 4:
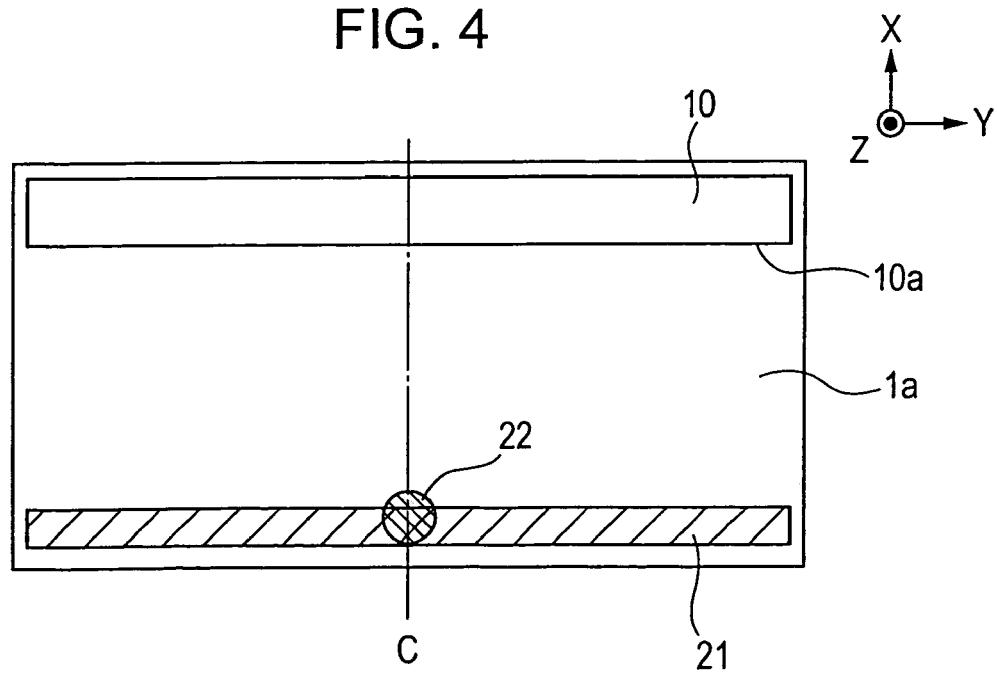
FIG. 4 is a plan view illustrating one of the steps in a method for manufacturing the thermal head shown in FIG. 1.

Subsequently, referring to FIG. 4, a first adhesive 21 is applied partially onto the second area on the top surface 1a of the aluminum heat sink 1. Specifically, the first adhesive 21 is applied in a direction parallel to the end surface 10a of the head substrate 10 to be adjoining the printed circuit board 30, i.e. the y-axis direction, at a substantially uniform width. After applying the first adhesive 21, a second adhesive 22 is applied onto a central portion of the first adhesive 21 such that the second adhesive 22 forms a substantially circular shape in plan view. The first adhesive 21 and the second adhesive 22 are then spread towards the head substrate 10, that is, in the x-axis direction, so as to form the adhesive layer 20 shown in FIG. 3. As described above, the adhesive layer 20 has the central portion C extending longer than the side portions in the x-axis direction, and is only partially formed in the area near where the end surface 30a of the printed circuit board 30 to be adjoining the head substrate 10 is to be disposed. The first adhesive 21 and the second adhesive 22 are composed of, for example, a silicon resin material.

After forming the adhesive layer 20, the printed circuit board 30 is attached onto the aluminum heat sink 1 via the adhesive layer 20 in a manner such that the end surface 10a of the head substrate 10 and the end surface 30a of the printed circuit board 30 adjoin each other. In this case, the adhesive layer 20 is not present in the areas below the end surface 30a of the printed circuit board 30 where the space α for communicating with the outside of the thermal head H1 is formed. Since it is actually difficult to make the end surface 30a of the printed circuit board 30 exactly flat, a significantly small gap 40 is formed between the end surface 10a and the end surface 30a of the respective head substrate 10 and printed circuit board 30. The space α communicates with the gap 40 formed between the printed circuit board 30 and the head substrate 10.

After attaching the head substrate 10 and the printed circuit board 30 onto the aluminum heat sink 1, the electrode pads 16 of the independent electrodes 15b on the head substrate 10 are wire-connected to the corresponding driving elements 31 on the printed circuit board 30 via the corresponding Au connection wires 33, which are bridged over the gap 40. Specifically, a supersonic vibration is applied to the surface of the electrode pad 16 of each independent electrode 15b in order to destroy the oxidized film on the electrode pad 16. Subsequently, each electrode pad 16 is coated with an alloy layer of Al and Au, and is then connected to the corresponding Au connection wire 33. Similarly, electrode pads disposed on the driving elements 31, which are not shown in the drawings, are connected to the corresponding Au connection wires 33.

The wire-connection unit including the electrode pads 16, the independent electrodes 15b, the driving elements 31 and so on connected with one another via the Au connection wires 33 is, for example, coated and sealed with the sealing resin 34 composed of a resin material, such as epoxy resin and silicon resin, whose viscosity decreases when heat is applied thereto. The heated sealing resin 34 in a low viscosity state covers the wire-connection unit without leaving any empty spaces, and also enters the gap 40 between the head substrate 10 and the printed circuit board 30 so as to fill the upper portion of the gap 40. In this case, the air trapped in the gap 40 is forced to travel towards the space α communicating with the gap 40, and is then released from the space α towards the outside of the thermal head H1. This prevents air bubbles, caused by the air trapped inside the gap 40, from being formed in the sealing resin 34. Consequently, this allows the sealing resin 34 to completely seal the wire-connection unit without forming any air holes or uneven surfaces.

Based on the process described above, the thermal head H1 shown in FIG. 1 is obtained.

In the second embodiment, although the sealing resin 34 entering the gap 40 can protrude deeper into the gap 40, the possibility of the sealing resin 34 reaching the adhesive layers 20 and 23 via the space α is low since the gap 40 communicates with the space α not having the adhesive layers 20 and 23 present therein. Consequently, the adhesive layer 20 intervening between the aluminum heat sink 1 and the printed circuit board 30, and the adhesive layer 23 intervening between the aluminum heat sink 1 and the head substrate 10 are capable of maintaining elasticity and absorbability to compensate for thermal expansion of the aluminum heat sink 1. Thus, even when the sealing resin 34 hardens while the aluminum heat sink 1 is thermally expanded, the elasticity of the adhesive layers 20 and 23 inhibits the warping of the head substrate 10 and the printed circuit board 30.

Furthermore, in the second embodiment, since the head substrate 10 and the printed circuit board 30 are preliminarily attached to the aluminum heat sink 1 prior to the wire-connecting step and the sealing step, the head substrate 10 and the printed circuit board 30 are advantageously made less bendable due to the adhesive layers 20 and 23. Thus, even when the sealing resin 34 hardens while the aluminum heat sink 1 is thermally expanded, the head substrate 10 and the printed circuit board 30 are effectively prevented from warping. This is effective when the surface area of the head substrate 10 is reduced in proportion to the size reduction of the thermal head H1 since the tolerance level against the bending of the head substrate 10 becomes lower.

Although the head substrate 10 in the above embodiments is a true-glaze type, the present invention can alternatively be applied to a thermal head provided with a head substrate of a partial-glaze type or a flat-glaze type, or a thermal head provided with a silicon head substrate.

Although the present invention has been explained by way of the examples described above, it should be understood to the ordinary skilled person in the art that the invention is not limited thereby, but rather that various changes or modifications thereof are possible without departing from the spirit of the invention. Accordingly, the scope of the invention shall be determined only by the appended claims and their equivalents.

What is claimed is:

1. A thermal head comprising:
a head substrate including a plurality of exothermic bodies which generate heat when electricity is supplied thereto, a common electrode connected with first ends of the exothermic bodies, and a plurality of independent electrodes connected with corresponding second ends of the exothermic bodies;
a printed circuit board including a plurality of driving elements for controlling the electricity supplied to the exothermic bodies on the head substrate; and
a heat sink on which the head substrate and the printed circuit board are disposed such that an end surface of the head substrate and an end surface of the printed circuit board adjoin each other,
wherein the plurality of independent electrodes and the plurality of driving elements are correspondingly wire-connected with each other across a gap formed between the adjoining end surfaces of the head substrate and the printed circuit board so as to define a wire-connection unit,
wherein the wire-connection unit is sealed with a resin material, and
wherein the printed circuit board and the heat sink have an adhesive layer partially disposed therebetween such that a space is provided between the printed circuit board and the heat sink, the space communicating with the outside of the thermal head and with the gap between the adjoining end surfaces of the head substrate and the printed circuit board.

2. The thermal head according to claim 1, wherein the space is disposed below the adjoining end surfaces of the head substrate and the printed circuit board, and is symmetrical in plan view with respect to a line perpendicular to a direction in which the adjoining end surfaces extend.

3. The thermal head according to claim 1, wherein the adhesive layer has a central portion and two side portions in plan view with respect to a direction in which the adjoining end surfaces extend, the central portion extending longer than the side portions in a direction perpendicular to the direction in which the adjoining end surfaces extend.

4. The thermal head according to claim 1, wherein attachment surfaces of the heat sink, the head substrate, and the printed circuit board are flat.

5. A method for manufacturing a thermal head, the method comprising:
providing a head substrate including a plurality of exothermic bodies which generate heat when electricity is supplied thereto, a common electrode connected with first ends of the exothermic bodies, and a plurality of independent electrodes connected with corresponding second ends of the exothermic bodies;

providing a printed circuit board including a plurality of driving elements for controlling the electricity supplied to the exothermic bodies on the head substrate; and providing a heat sink on which the head substrate and the printed circuit board are attached in a manner such that an end surface of the head substrate and an end surface of the printed circuit board adjoin each other, wherein the plurality of independent electrodes and the plurality of driving elements are correspondingly wire-connected with each other across a gap formed between the adjoining end surfaces of the head substrate and the printed circuit board so as to define a wire-connection unit, wherein the wire-connection unit is sealed with a resin material, and wherein the printed circuit board and the heat sink have an adhesive layer partially disposed therebetween such that a space is provided between the printed circuit board and the heat sink, the space communicating with the outside of the thermal head and with the gap between the adjoining end surfaces of the head substrate and the printed circuit board.

6. The method according to claim 5, further comprising:
attaching the head substrate onto the heat sink;
applying a first adhesive onto the heat sink in a direction parallel to the end surface of the head substrate to be adjoining the printed circuit board at a substantially uniform width;
applying a second adhesive to a central portion of the first adhesive such that the second adhesive forms a substantially circular shape in plan view;
spreading the first adhesive and the second adhesive towards the head substrate so as to form an adhesive layer having a central portion and two side portions in plan view with respect to a direction in which the end surface of the head substrate to be adjoining the printed circuit board extend, the central portion extending longer than the side portions in a direction perpendicular to the direction in which the end surface of the head substrate extend; and
attaching the printed circuit board onto the heat sink via the adhesive layer such that the end surface of the printed circuit board and the end surface of the head substrate adjoin each other.

7. The method according to claim 5, further comprising:
wire-connecting the plurality of independent electrodes in the head substrate with the plural electrodes of driving elements in the printed circuit board so as to form the wire-connection unit; and
sealing the wire-connection unit.

8. A thermal head comprising:
a head substrate;
a printed circuit board;
a heat sink on which the head substrate and the printed circuit board are disposed such that an end surface of the head substrate and an end surface of the printed circuit board adjoin each other with a gap therebetween;
a resin covering the head substrate and the printed circuit board, the resin disposed between the adjoining end surfaces of the head substrate and the printed circuit board to form a boundary of the gap; and
an adhesive layer attaching the heat sink and the printed circuit board such that a space connecting the outside of the thermal head and the gap is formed between the heat sink and the printed circuit board.

9. The thermal head according to claim 8, wherein an entire surface of the heat sink overlapped by the resin is planar.

10. The thermal head according to claim 8, wherein the adhesive layer is symmetrical in plan view with respect to a line perpendicular to a direction in which the adjoining end surfaces extend.

11. The thermal head according to claim 10, wherein the adhesive layer is non-rectangular.

12. The thermal head according to claim 11, wherein an amount of area covered by the adhesive layer is larger at a center of the adhesive layer than at ends of the adhesive layer.

13. The thermal head according to claim 12, wherein the amount of area covered by the adhesive layer decreases unilaterally from the center to the ends of the adhesive layer.

14. The thermal head according to claim 13, wherein a side of the adhesive layer most proximate to the head substrate is curved from the center of the adhesive layer.

15. The thermal head according to claim 8, wherein surfaces of the heat sink, the head substrate, and the printed circuit board contacting the adhesive layer are flat.

16. The thermal head according to claim 8, wherein the adhesive layer attaches the heat sink and the head substrate.

17. The thermal head according to claim 16, wherein the adhesive layer attaching the heat sink and the head substrate contacts substantially all of a surface of the head substrate facing the heat sink.

18. The thermal head according to claim 16, wherein the resin does not contact the adhesive layer.

19. The thermal head according to claim 16, wherein a region between end surfaces of the head substrate and the printed circuit board is devoid of the adhesive layer.

20. The thermal head according to claim 8, wherein the resin does not contact the heat sink.

21. A thermal head comprising:
a head substrate;
a printed circuit board;
a heat sink on which the head substrate and the printed circuit board are disposed such that an end surface of the head substrate and an end surface of the printed circuit board adjoin each other with a gap therebetween;
a resin covering the head substrate and the printed circuit board, the resin disposed between the adjoining end surfaces of the head substrate and the printed circuit board;
means for preventing air holes from being formed in the resin and inhibiting warping of the head substrate caused by thermal expansion; and
wherein the means for preventing communicates with a surface portion of the heat sink and does not penetrate below the surface portion.

22. The thermal head according to claim 21, wherein the means comprises means for attaching the printed circuit board and head substrate to the heat sink without permitting the resin to contact the attaching means.

23. The thermal head according to claim 21, wherein an entire surface of the heat sink overlapped by the resin is planar.

* * * * *